United States Patent
Khasnis et al.

(10) Patent No.: US 10,171,093 B2
(45) Date of Patent: Jan. 1, 2019

(54) SLEW RATE LOCKED LOOP

(71) Applicant: Signalchip Innovations Private Limited, Bengaluru (IN)

(72) Inventors: Himamshu Gopalakrishna Khasnis, Bengaluru (IN); Sujith Kumar Nagaraj, Bengaluru (IN)

(*) Notice: Subject to any disclaimer, the term of this patent is extended or adjusted under 35 U.S.C. 154(b) by 162 days.

(21) Appl. No.: 15/459,498

(22) Filed: Mar. 15, 2017

(65) Prior Publication Data
US 2017/0272086 A1 Sep. 21, 2017

(30) Foreign Application Priority Data
Mar. 15, 2016 (IN) .............................. 201641009007

(51) Int. Cl.
*H03L 7/06* (2006.01)
*H03L 7/093* (2006.01)
*H03K 19/003* (2006.01)

(52) U.S. Cl.
CPC ....... *H03L 7/093* (2013.01); *H03K 19/00361* (2013.01)

(58) Field of Classification Search
CPC .......................... H03L 7/156; H03K 19/00361

USPC ......................................................... 327/156
See application file for complete search history.

(56) References Cited

U.S. PATENT DOCUMENTS

2005/0285648 A1* 12/2005 Wilson ................... H03K 5/023
327/172

* cited by examiner

*Primary Examiner* — Lincoln D Donovan
*Assistant Examiner* — Metasebia T Retebo
(74) *Attorney, Agent, or Firm* — The Law Office of Austin Bonderer, PC; Austin Bonderer

(57) ABSTRACT

A method of controlling and maintaining a constant slew rate at an output of a buffer is provided. The method includes the following steps: (a) receiving, (i) a first input signal and (ii) at least one of a control voltage using the buffer; (b) generating a threshold voltage using a first reference voltage generator; (c) comparing (i) the threshold voltage with an output of the buffer using at least one of a comparator; (d) determining a phase difference using a phase detector; (e) producing a DC voltage using a loop filter; (f) generating a reference voltage; (g) receiving the DC voltage and the reference voltage using an amplifier; (h) amplifying the difference between (a) said DC voltage, and (b) the reference voltage to obtain a control voltage using the amplifier; and (i) feeding the control voltage to the buffer.

10 Claims, 9 Drawing Sheets

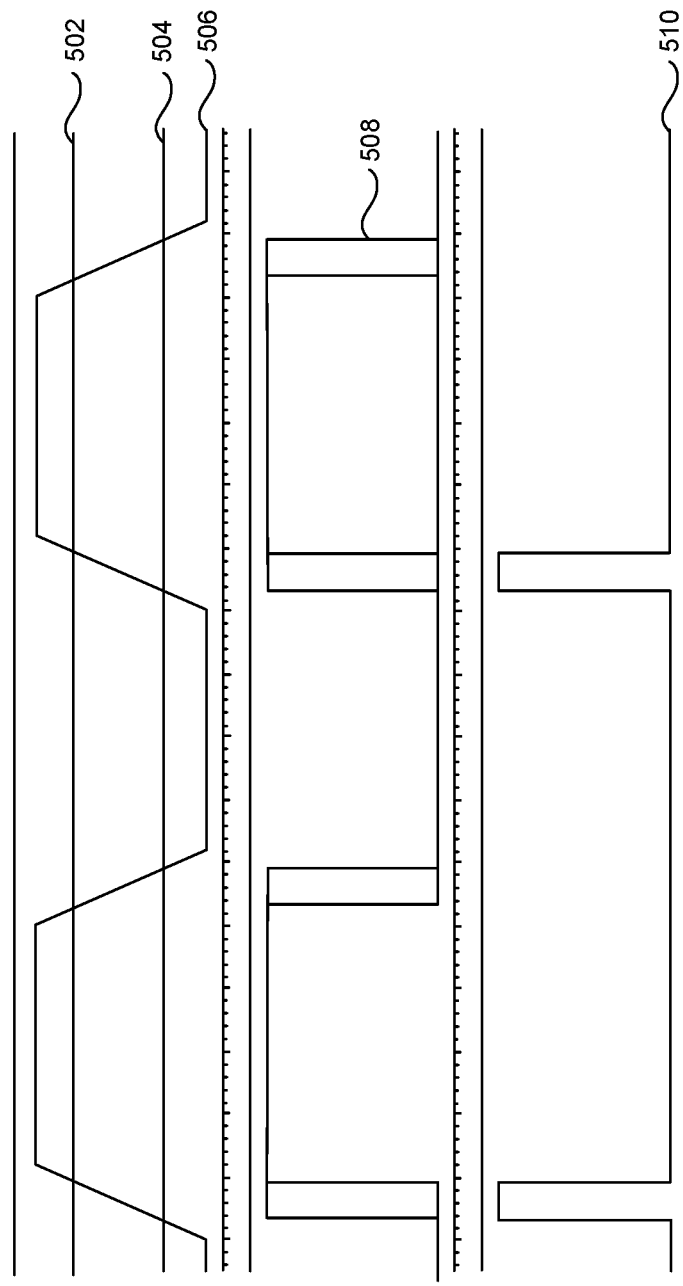

SLEW RATE LOCKED LOOP

CROSS-REFERENCE TO RELATED APPLICATIONS

This application claims priority to Indian patent application no. 201641009007 filed on Mar. 15, 2016, the complete disclosure of which, in its entirely, is herein incorporated by reference.

BACKGROUND

Technical Field

The embodiments herein generally relate to slew rate, and more particularly, to a method for controlling and maintaining a constant slew rate.

Description of the Related Art

Slew rate is defined as the rate of change in output voltage with time. The slew rate may be measured using an oscilloscope. In high speed input output (IO) buffers, matching the impedance with the transmission line connecting receivers is required to preserve the signal integrity at the inputs of the receivers. Matching of IO buffer resistances may be achieved at a good accuracy, but due to varying capacitive loads at the IO buffer outputs and variable operating frequencies, matching the reactance becomes difficult. Here, in these situations the magnitude of the reflections is affected by the rise time and fall time of the inputs and outputs. Sharper inputs result in higher magnitudes of ISI (intersymbol Interference). In the cases of data bus, NEXT (Near-end crosstalk) and FEXT (Far-and crosstalk) occur which are undesirable. Hence, the slew rates at the inputs have to be controlled and reduced to minimize the above-mentioned effects. The slew rate should remain constant across variations in load, process, temperature, and supply voltage.

FIG. 1 illustrates a block diagram of a typical output buffer in accordance with an exemplary scenario. The block diagram includes a pre-driver slew rate compensation circuit 102, a driver impedance compensation circuit 104, a compensation circuit 106, a temperature detection circuit 108 and a voltage detection circuit 110. The pre-driver slew rate compensation circuit 102 receives a slew rate control signal from the compensation circuit 106. The driver impedance compensation circuit 104 receives an impedance control signal from the compensation circuit 106. The temperature detection circuit 108 detects the temperature of the typical output buffer and provides a signal based on the detection to the compensation circuit 106. Similarly, the voltage detection circuit 110 detects a supply voltage provided to the typical output buffer and provides a signal based on this detection to the compensation circuit 106.

The compensation circuit 106 controls only the slew rate at the output of the pre-driver slew rate compensation circuit 102, which drives the driver impedance compensation circuit 104. The slew rate at the pre-driver slew rate compensation circuit 102 is inversely proportional to the product of the resistance of the pre-driver slew rate compensation circuit 102 and an input capacitance of the driver impedance compensation circuit 104. The compensation circuit 106 generates signals which adjusts the output resistance of the pre-driver slew rate compensation circuit 102 and hence maintains the RC product constant. However, to have slew rate depend only on the RC product requires very sharp rising/falling edges at the input to the pre-driver slew rate compensation circuit 102. Hence, the circuit drives the pre-driver slew rate compensation circuit 102 must be very strong which inevitably consumes more power and area.

Due to practical constraints, there will be finite rise/fall time at the input of the pre-driver slew rate compensation circuit 102 which results in error in the slew rate at the output of the pre-driver slew rate compensation circuit 102 across process, voltage and temperature (PVT). Also the main disadvantage of this technique is that it assumes constant slew rate at the input of a circuit that results inconstant output slew rate. If there are variations in the load, process, temperate and voltage, it results in huge variation of the slew rate. The compensation circuit 106 tries to compensate for (a) temperature using the temperature detection circuit 108 and (b) voltage using the voltage detection circuit 110, but since there is no feedback mechanism, there will be error in the slew rate. Also, there is no account for variations in load and process.

Accordingly, there remains a need for controlling and maintaining the slew rate at the output of the buffer accurately to a desired value and is independent of the variations in the output load, process, temperature, and supply voltages.

SUMMARY

In view of a foregoing, an embodiment herein provides a method for controlling and maintaining a constant slew rate at an output of a buffer. The method includes the following steps of: (a) receiving, using the buffer, (i) a first input signal and (ii) at least one of a control voltage; (b) generating, using a first reference voltage generator, a threshold voltage; (c) comparing, using at least one of a comparator, the threshold voltage with an output of the buffer to obtain an output digital signal; (d) determining, using a phase detector, a phase difference; (e) producing, using a loop filter, a DC voltage from an output of the phase detector; (f) generating, using a second reference voltage generator, a reference voltage; (g) receiving, by an amplifier, the DC voltage from the loop filter and the reference voltage from the second reference voltage generator; (h) amplifying, using the amplifier, the difference between (a) the DC voltage from the loop filter and (b) the reference voltage to obtain a control voltage; and (i) feeding the control voltage to the buffer, wherein the slew rate at the output of the buffer is determined using the control voltage.

In one aspect, a slew rate locked loop circuit for controlling and maintaining a constant slew rate at an output of a buffer is provided. The buffer receives (i) a first input signal and (ii) at least one of a control voltage. The slew rate locked loop circuit includes a slew rate detection unit, a loop filter, a second reference voltage generator and an amplifier. The slew rate detection unit includes a first reference voltage generator, a first comparator, a second comparator and a phase detector. The first reference voltage generator generates (i) an upper threshold voltage ($V_h$) and (ii) a lower threshold voltage ($V_l$). The first comparator compares the upper threshold voltage ($V_h$) with the output of the buffer to obtain a first output digital signal. The second comparator compares the lower threshold voltage ($V_l$) with the output of the buffer to obtain a second output digital signal. The phase detector determines a phase difference between the first output digital signal and the second output digital signal. The phase difference is directly proportional to the slew rate at the output of the buffer. The loop filter produces a DC voltage from an output of the phase detector. The second reference voltage generator generates a reference voltage.

The amplifier receives the DC voltage from the loop filter and the reference voltage generated by the second reference voltage generator. The amplifier amplifies the difference between (i) the DC voltage from the loop filter, and (ii) the reference voltage to obtain a control voltage. The control voltage is fed back to the buffer. The slew rate at the output of the buffer is determined using the control voltage.

In an embodiment, the output of the phase detector is high when the output of the buffer is between the upper threshold voltage ($V_h$) and the lower threshold voltage ($V_l$). The output of the phase detector is low when the output of the buffer is not between the upper threshold voltage ($Vh$) and the lower threshold voltage ($V_l$).

In another embodiment, the output of the phase detector is low when the output of the buffer is between the upper threshold voltage ($V_h$) and the lower threshold voltage ($V_l$). The output of the phase detector is high when the output of the buffer is not between the upper threshold voltage ($V_h$) and the lower threshold voltage ($V_l$).

In yet another embodiment, the constant slew rate is obtained when an error between an output of the loop filter and the reference voltage of the second reference voltage generator becomes zero.

In yet another embodiment, a time taken (t) from the output of the buffer to swing from the upper threshold voltage ($V_h$) to the lower threshold voltage ($V_l$) is controlled by an equation which is slew rate=$(V_h-V_l)/t$.

In yet another embodiment, the upper threshold voltage ($V_h$) and the lower threshold voltage ($V_l$) of the first reference voltage generator and the reference voltage of the second reference voltage generator track a power supply to equalize power supply variations.

In another aspect, a slew rate locked loop circuit for controlling and maintaining a constant slew rate at an output of a buffer is provided. The buffer receives (i) a first input signal and (ii) at least one of a control voltage. The circuit includes a slew rate detection unit, a loop filter, a second reference voltage generator and an amplifier. The slew rate detection unit includes a first reference voltage generator, a comparator and a phase detector. The first reference voltage generator generates a threshold voltage. The comparator compares the threshold voltage with the output of the buffer to obtain an output digital signal. The phase detector determines a phase difference between the output digital signal and a second input signal. The phase difference is directly proportional to the slew rate at the output of the buffer. The loop filter produces a DC voltage from an output of the phase detector. The second reference voltage generator generates a reference voltage. The amplifier (a) receives the DC voltage from the loop filter and the reference voltage generated by the second reference voltage generator, and (b) amplifies the difference between (i) the DC voltage from the loop filter and (ii) the reference voltage to obtain a control voltage. The control voltage is fed back to the buffer. The slew rate at the output of the buffer is determined using the control voltage.

In an embodiment, the slew rate of the buffer is directly proportional to the reference voltage of the second reference voltage generator which is constant.

In another embodiment, the constant slew rate is obtained when an error between the output of the loop filter and the reference voltage of the second reference voltage generator becomes zero.

The above-mentioned technique can be used to maintain and control the output slew rate of buffers constant across process, voltage and temperature (PVT).

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 5A illustrates a graphical view of operational waveforms for the slew rate locked loop when comparators produce a high output voltage of FIGS. 2A-2B according to an embodiment herein;

DETAILED DESCRIPTION OF PREFERRED EMBODIMENTS

Figure 1:
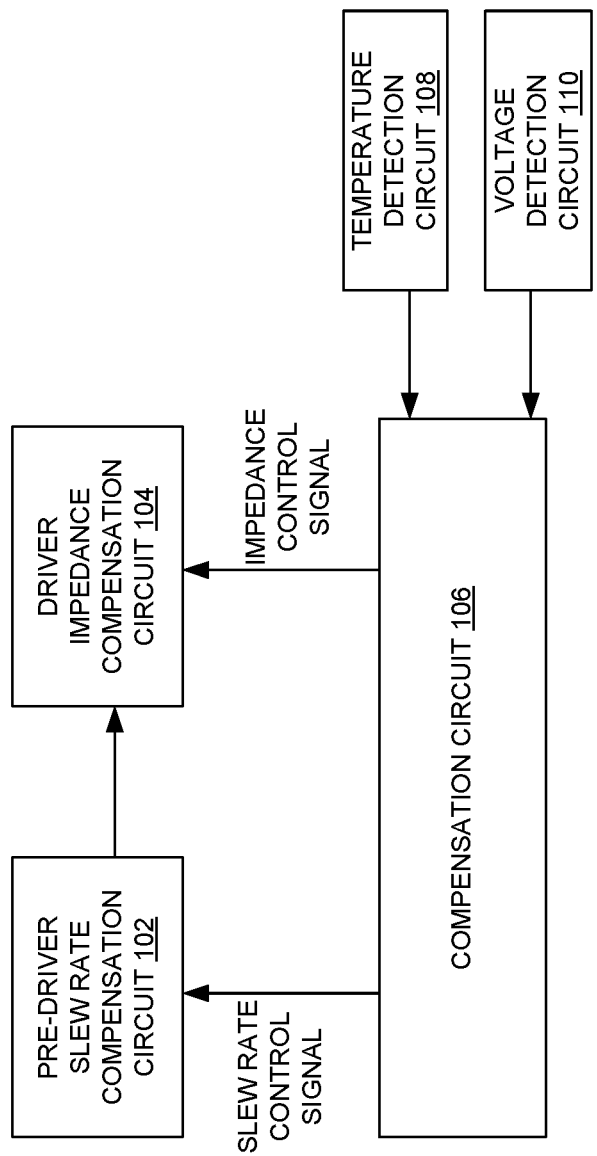
FIG. 1 illustrates a block diagram of a typical output buffer in accordance with an exemplary scenario.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Various embodiments provide methods and circuits to control and maintain a constant slew rate at an output of a buffer. As mentioned, there remains a need for a method and a circuit which controls and maintains the slew rate at the output of the buffer accurately to a desired value and is independent of the variations in the output load, process, temperature, and supply voltages. Referring now to the drawings, and more particularly to FIGS. 2A through 7, where similar reference characters denote corresponding features consistently throughout the figures, there are shown preferred embodiments.

Figure 2A:
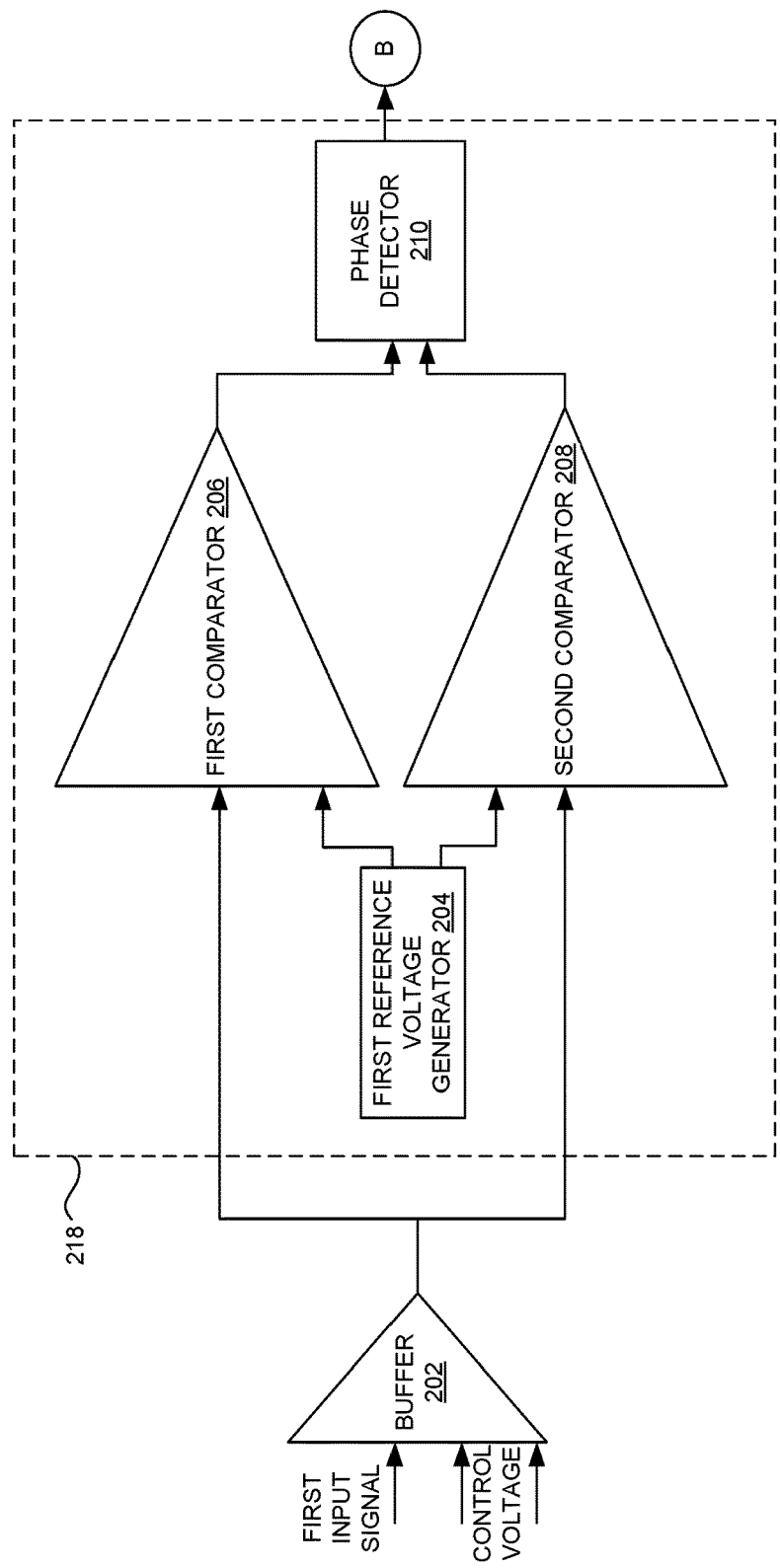
FIGS. 2A-2B illustrate a block level implementation of a slew rate locked loop according to an embodiment herein.
Figure 2B:
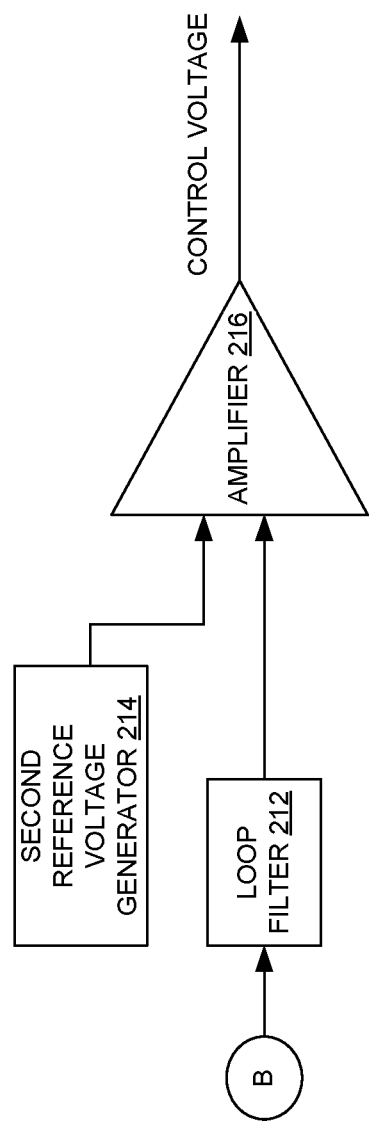

FIGS. 2A-2B illustrate a block level implementation of a slew rate locked loop according to an embodiment herein. The block level implementation of a slew rate locked loop includes a buffer 202, a slew rate detection unit 218, a loop filter 212, a second reference voltage generator 214, and an amplifier 216. The slew rate detection unit 218 includes a first reference voltage generator 204, a first comparator 206, a second comparator 208 and a phase detector 210. A slew rate of the buffer 202 is what should be controlled and maintained. In one embodiment, (i) a first input signal and (ii) at least one of a control voltage are fed to the buffer 202 as inputs. The first reference voltage generator 204 generates (i) an upper threshold voltage ($V_h$) and (ii) a lower threshold voltage ($V_l$). In one embodiment, a time taken (t) from an output of the buffer 202 to swing from the upper threshold voltage ($V_h$) to the lower threshold voltage ($V_l$) is also controlled. The slew rate is then controlled which obeys the equation, the slew rate=$(V_h-V_l)/t$.

The first comparator 206 compares the upper threshold voltage ($V_h$) with the output of the buffer 202 to obtain a first output digital signal. The second comparator 208 compares the lower threshold voltage ($V_l$) with the output of the buffer 202 to obtain a second output digital signal. The phase detector 210 determines a phase difference between the first output digital signal and the second output digital signal. In an embodiment, the phase difference is directly proportional to the slew rate at the output of the buffer 202.

The loop filter 212 produces a DC voltage of an output of the phase detector 210. In an embodiment, the output of the phase detector 210 is high when the output of the buffer 202 is between the upper threshold voltage ($V_h$) and the lower threshold voltage ($V_l$). In another embodiment, the output of the phase detector 210 is low when the output of the buffer 202 is not between the upper threshold voltage ($V_h$) and the lower threshold voltage ($V_l$). In yet another embodiment, the output of the phase detector 210 is low when the output of the buffer 202 is between the upper threshold voltage ($V_h$) and the lower threshold voltage ($V_l$). In yet another embodiment, the output of the phase detector 210 is high when the output of the buffer 202 is not between the upper threshold voltage ($V_h$) and the lower threshold voltage ($V_l$). The second reference voltage generator 214 generates a reference voltage. The amplifier 216 receives (i) the DC voltage from the loop filter 212 and (ii) the reference voltage generated by the second reference voltage generator 214. The amplifier 216 amplifies the difference between (i) the DC voltage from the loop filter 212, and (ii) the reference voltage to obtain a control voltage. The control voltage is fed back to the buffer 202. In an embodiment, the slew rate at the output of the buffer 202 is determined using the control voltage.

In another embodiment, the constant slew rate is obtained when an error between an output of the loop filter 212 and the reference voltage of the second reference voltage generator 214 becomes zero. The slew rate at the output of the buffer 202 is directly proportional to the reference voltage of the second reference voltage generator 214 which is constant. Hence, the slew rates remain constant independent of load, process, and temperature. The upper threshold voltage ($V_h$) and the lower threshold voltage ($V_l$) of the first reference voltage generator 204 and the reference voltage of the second reference voltage generator 214 track the power supply to equalize power supply variations.

Figure 3:
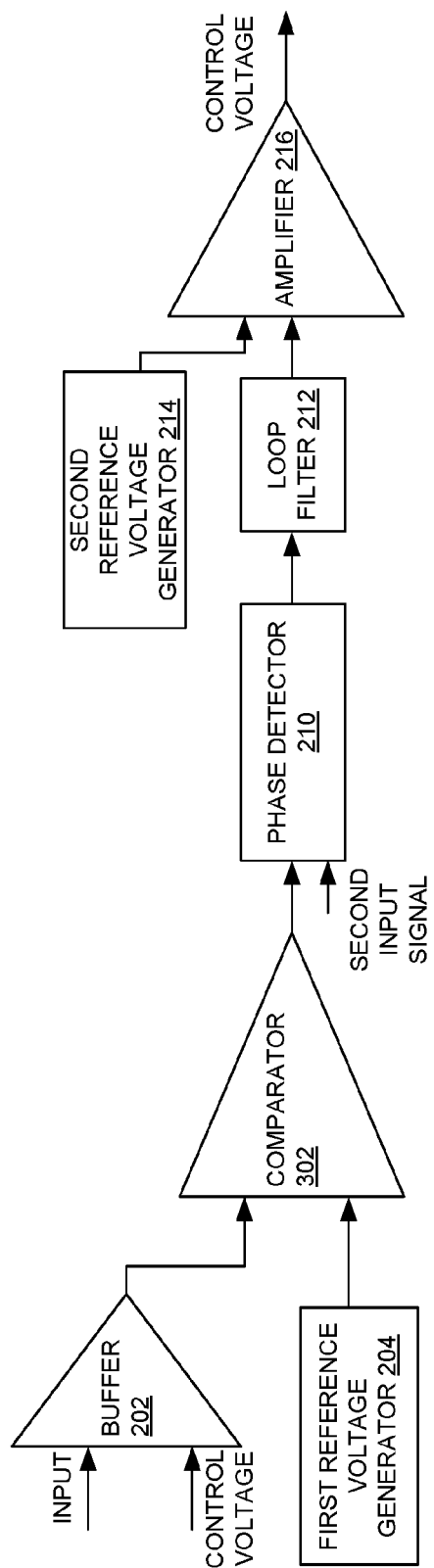
FIG. 3 illustrates a block level implementation of a slew rate locked loop including a comparator according to an embodiment herein.

With reference to FIGS. 2A-2B, FIG. 3 illustrates a block level implementation of a slew rate locked loop including a comparator 302 according to an embodiment herein. The slew rate locked loop includes the comparator 302, and is implemented when some following conditions are met. In one embodiment, the first condition is when the upper threshold voltage ($V_h$) is equivalent to a source voltage ($V_{DD}$) and the lower threshold voltage ($V_l$) is equivalent to half of the source voltage ($V_{DD}$). In another embodiment, the second condition is when the upper threshold voltage ($V_h$) is equivalent to half of the source voltage ($V_{DD}$) and the lower threshold voltage ($V_l$) is equivalent to zero. The comparator 302 compares the output of the buffer 202 with a threshold voltage generated by the first reference voltage generator 204 to obtain an output digital signal. In an embodiment, the phase detector 210 determines a phase difference between the output digital signal and a second input signal. The loop filter 212 produces a DC voltage from an output of the phase detector 210. The second reference voltage generator 214 generates a reference voltage. The amplifier 216 receives the DC voltage from the loop filter 212 and the reference voltage generated by the second reference voltage generator 214. The amplifier 216 further amplifies (i) the DC voltage from the loop filter 212 and (ii) the reference voltage to obtain a control voltage. The control voltage is fed back to the buffer 202. In another embodiment, the slew rate at the output of the buffer 202 is determined using the control voltage.

Figure 4:
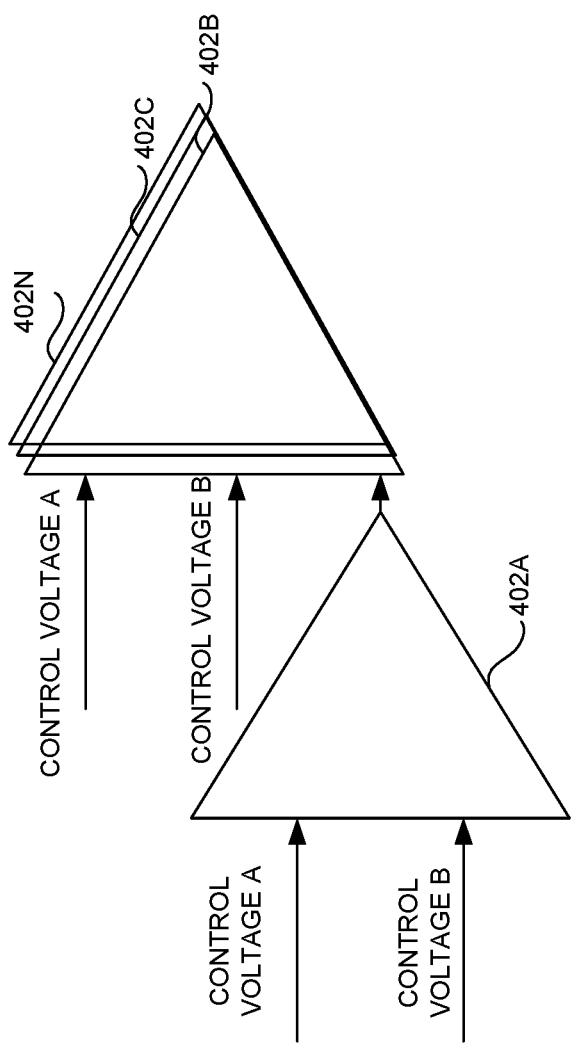
FIG. 4 illustrates one or more buffers calibrated using a replica buffer according to an embodiment herein.

FIG. 4 illustrates one or more buffers 402A-N calibrated using a replica buffer according to an embodiment herein. Calibration of slew rates of the one or more buffers 402A-N lead to huge consumption of power and area. The calibration of the slew rate of the one or more buffers 402A-N distributes control voltages to rest that saves power and area.

FIG. 5A illustrates a graphical view of operational waveforms for the slew rate locked loop circuit when the comparators (206 and 208) produce a high output voltage of FIGS. 2A-2B according to an embodiment herein. The graphical view of the operational waveforms includes a first upper threshold voltage wave 502, a first lower threshold voltage wave 504, a first buffer output wave 506, a first comparator and a second comparator wave with the high output voltage 508, and a first phase detector wave 510. The first comparator 206 produces a high output voltage when the output of the buffer 202 is above the upper threshold ($V_h$). In an embodiment, the first comparator 206 produces low output voltage ($V_l$) when the output the buffer 202 is below the upper threshold ($V_h$). The second comparator 208 produces the high output voltage when the output of the buffer 202 is above the lower threshold ($V_l$). In an embodiment, the second comparator 208 produces low output voltage when the output of the buffer 202 is below the lower threshold ($V_l$).

Figure 5B:
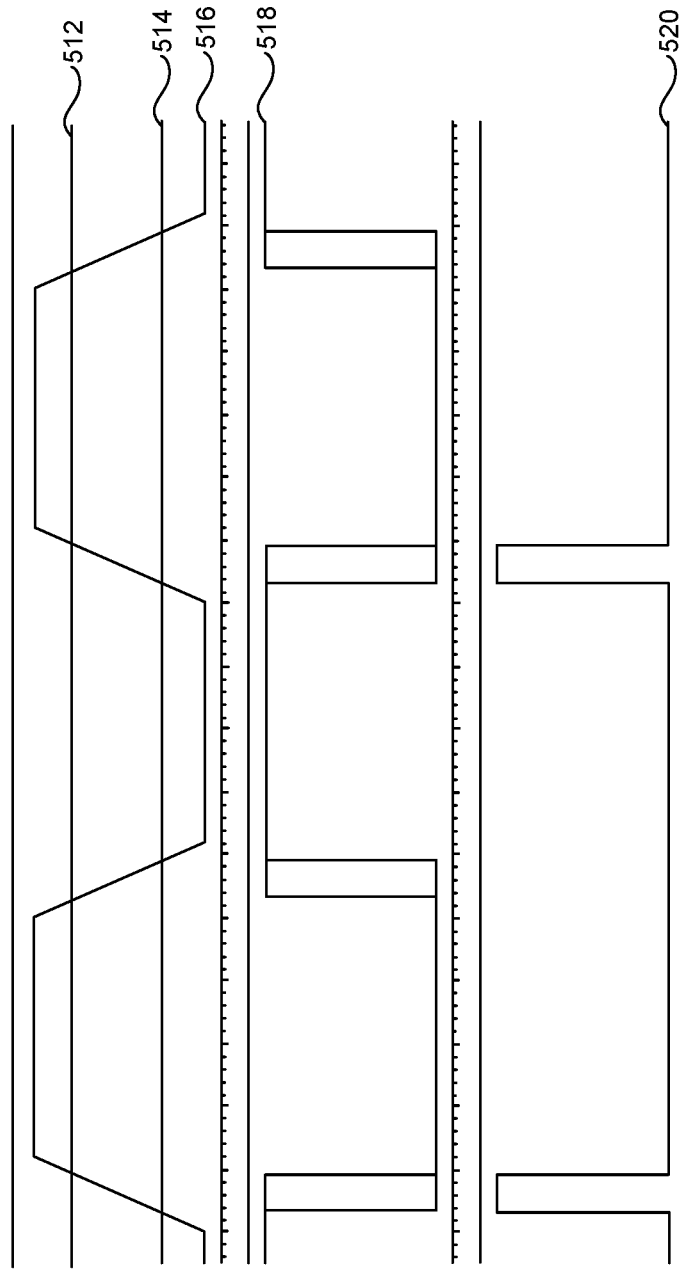
FIG. 5B illustrates a graphical view of operational waveforms for the slew rate locked loop when the comparators produce a low output voltage of FIGS. 2A-2B according to an embodiment herein.

FIG. 5B illustrates a graphical view of operational waveforms for the slew rate locked loop circuit when the comparators (206 and 208) produce a low output voltage of FIGS. 2A-2B according to an embodiment herein. The graphical view of the operational waveforms includes a second upper threshold voltage wave 512, a second lower threshold voltage wave 514, a second buffer output wave 516, the first comparator and the second comparator wave with the low output voltage 518 and a second phase detector wave 520. The first comparator 206 produces a low output voltage when the output of the buffer 202 is above the upper threshold ($V_h$). In an embodiment, the first comparator 206 produces high output voltage when the output of the buffer 202 is below the upper threshold ($V_h$). In an embodiment, the second comparator 208 produces the low output voltage when the output of the buffer 202 is above the lower threshold ($V_l$). In an embodiment, the second comparator 208 produces high output voltage when the output of the buffer 202 is below the lower threshold ($V_l$).

Figure 6:
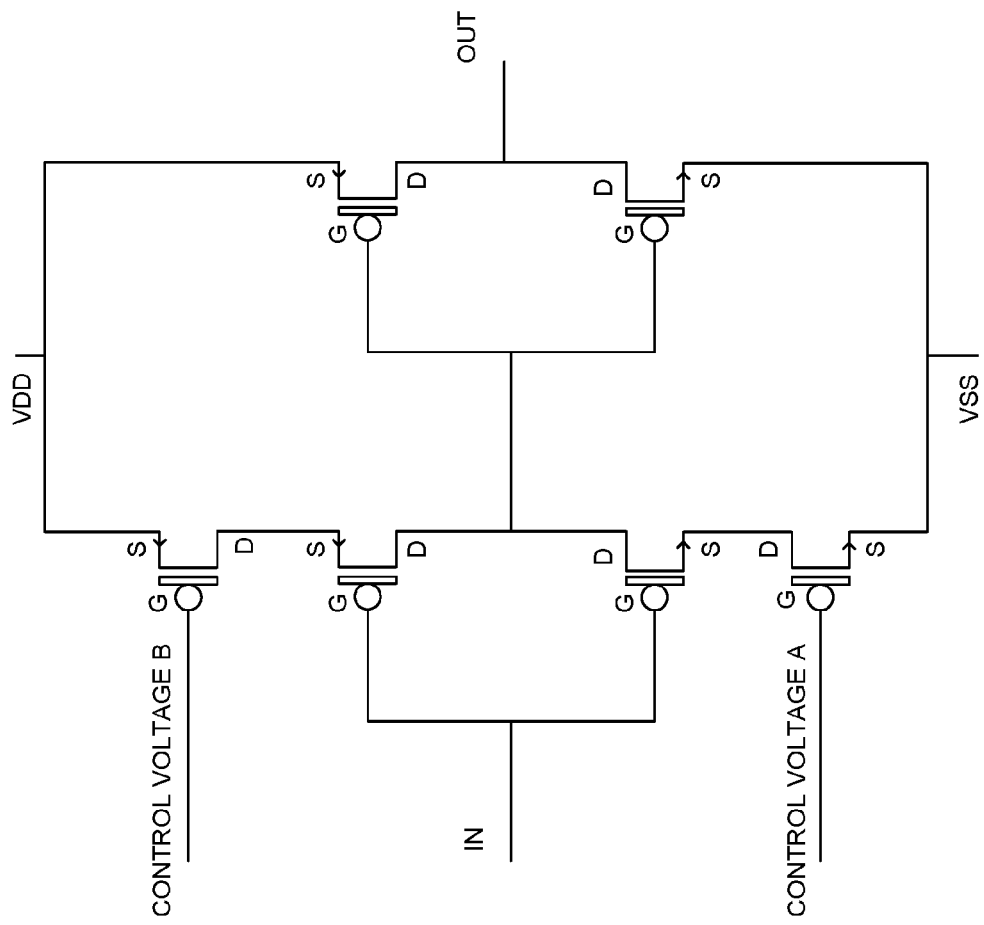
FIG. 6 illustrates two simple architectures of a buffer according to an embodiment herein.
Figure 6:
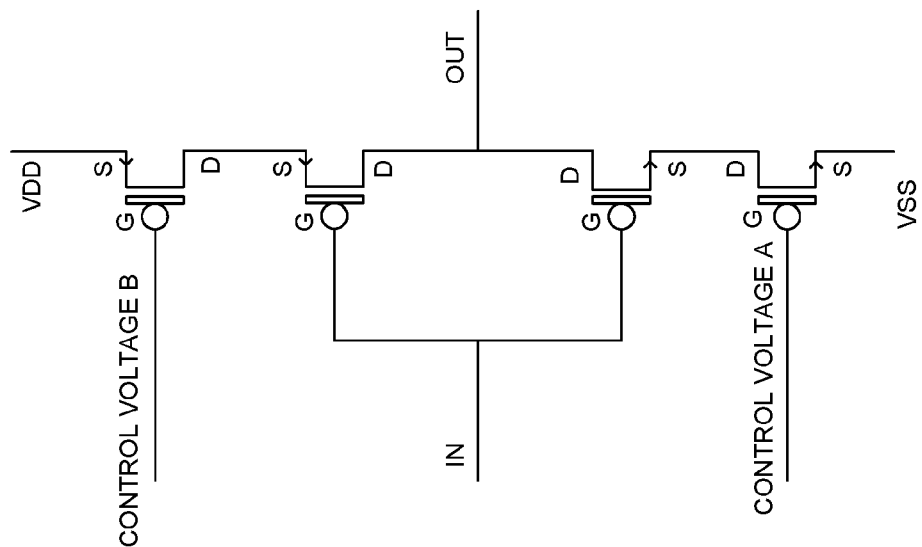

FIG. 6 illustrates two simple architectures of a buffer according to an embodiment herein. The architectures include one or more negative channel metal-oxide semiconductor (NMOS) transistors and one or more positive channel metal-oxide semiconductor (PMOS) transistors. The one or more NMOS transistor receives a control voltage A and the one or more PMOS transistor receives a control voltage B. The slew rate locked loop is applicable for any voltage controlled buffer.

Figure 7:
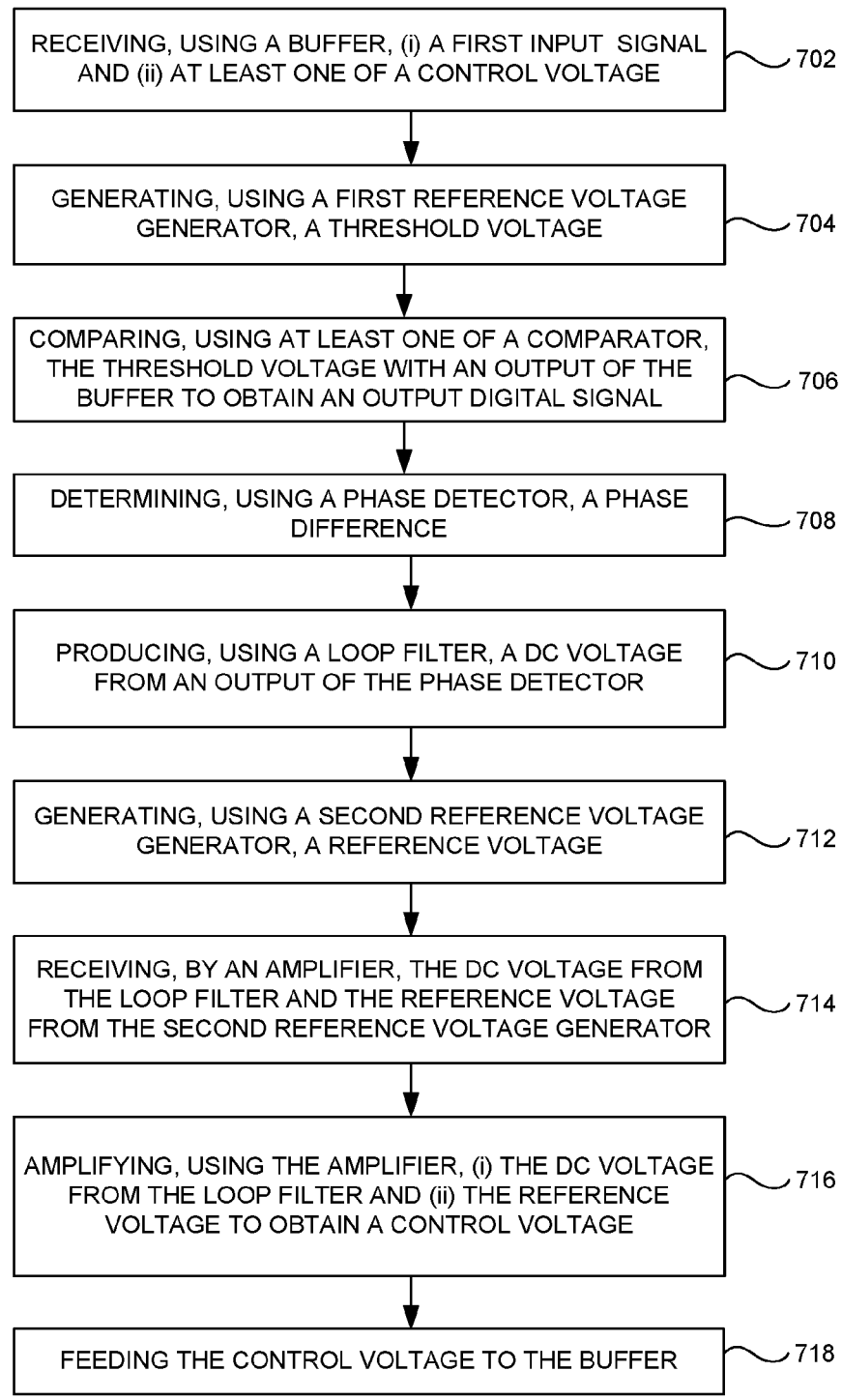
FIG. 7 is flow diagram illustrating a method for controlling and maintaining a slew rate at an output of the buffer of FIGS. 2A-2B according to an embodiment herein.

FIG. 7 is a flow diagram illustrating a method for controlling and maintaining a slew rate at an output of the buffer 202 of FIGS. 2A-2B according to an embodiment herein. At step 702, (i) a first input signal and (ii) at least one of a control voltage are received as inputs using the buffer 202. At step 704, a threshold voltage is generated using the first reference voltage generator 204. At step 706, the threshold voltage is compared with an output of the buffer 202 to obtain an output digital signal using at least one of a comparator. At step 708, a phase difference is determined using a phase detector 210. At step 710, a DC voltage from an output of the phase detector 210 is produced using a loop filter 212. At step 712, a reference voltage is generated using a second reference voltage generator 214. At step 714, the DC voltage from the loop filter 212 and the voltage from the second reference voltage generator 214 are received by an amplifier 216. At step 716, (i) the DC voltage from the loop filter 212 and the reference voltage are amplified to obtain a control voltage using the amplifier 216. At step 718, the control voltage is fed to the buffer 202. In an embodiment, the slew rate at the output of the buffer 202 is determined using the control voltage.

The foregoing description of the specific embodiments will so fully reveal the general nature of the embodiments herein that others can, by applying current knowledge, readily modify and/or adapt for various applications such specific embodiments without departing from the generic concept, and therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein may be practiced with modification within the spirit and scope of the appended claims.

What is claimed is:

1. A method for controlling and maintaining a constant slew rate at an output of a buffer, comprising:
   receiving, using said buffer, (i) a first input signal and (ii) at least one of a control voltage;
   generating, using a first reference voltage generator, a threshold voltage;
   comparing, using at least one of a comparator, said threshold voltage with an output of said buffer to obtain an output digital signal;
   determining, using a phase detector, a phase difference;
   producing, using a loop filter, a DC voltage from an output of said phase detector;
   generating, using a second reference voltage generator, a reference voltage;
   receiving, by an amplifier, said DC voltage from said loop filter and said reference voltage from said second reference voltage generator;
   amplifying, using said amplifier, the difference between (i) said DC voltage from said loop filter and (ii) said reference voltage to obtain a control voltage; and
   feeding said control voltage to said buffer, wherein said slew rate at said output of said buffer is determined using said control voltage.

2. A slew rate locked loop circuit for controlling and maintaining a constant slew rate at an output of a buffer, wherein said buffer receives (i) a first input signal and (ii) at least one of a control voltage, said slew rate locked loop circuit comprising:
   a slew rate determining unit that comprises:
      a first reference voltage generator that generates (i) an upper threshold voltage ($V_h$) and (ii) a lower threshold voltage ($V_l$);
      a first comparator that compares said upper threshold voltage ($V_h$) with said output of said buffer to obtain a first output digital signal;
      a second comparator, that compares said lower threshold voltage ($V_l$) with said output of said buffer to obtain a second output digital signal; and
      a phase detector that determines a phase difference between said first output digital signal and said second output digital signal, wherein said phase difference is directly proportional to said slew rate at said output of said buffer;
   a loop filter that produces a DC voltage from an output of said phase detector;
   a second reference voltage generator that generates a reference voltage; and
   an amplifier that (a) receives said DC voltage from said loop filter and said reference voltage generated by said second reference voltage generator, and (b) amplifies the difference between (i) said DC voltage from said loop filter and (ii) said reference voltage to obtain a control voltage, wherein said control voltage is fed back to said buffer, wherein said slew rate at said output of said buffer is determined using said control voltage.

3. The slew rate locked loop circuit of claim 2, wherein said output of said phase detector is high when said output of said buffer is between said upper threshold voltage ($V_h$) and said lower threshold voltage ($V_l$), wherein said output of said phase detector is low when said output of said buffer is not between said upper threshold voltage ($V_h$) and said lower threshold voltage ($V_l$).

4. The slew rate locked loop circuit of claim 2, wherein said output of said phase detector is low when said output of said buffer is between said upper threshold voltage ($V_h$) and said lower threshold voltage ($V_l$), wherein said output of said phase detector is high when said output of said buffer is not between said upper threshold voltage ($V_h$) and said lower threshold voltage ($V_l$).

5. The slew rate locked loop circuit of claim 2, wherein said constant slew rate is obtained when an error between an output of said loop filter and said reference voltage of said second reference voltage generator becomes zero.

6. The slew rate locked loop circuit of claim 2, wherein a time taken (t) from said output of said buffer to swing from said upper threshold voltage ($V_h$) to said lower threshold voltage ($V_l$) is controlled by an equation which is slew rate=$(V_h-V_l)/t$.

7. The slew rate locked loop circuit of claim 2, wherein said upper threshold voltage ($V_h$) and said lower threshold voltage ($V_l$) of said first reference voltage generator and said reference voltage of said second reference voltage generator track a power supply to equalize power supply variations.

8. A slew rate locked loop circuit for controlling and maintaining a constant slew rate at an output of a buffer, wherein said buffer receives (i) a first input signal, and (ii) at least one of a control voltage, said slew rate locked loop circuit comprising:

a slew rate determining unit that comprises:
   a first reference voltage generator that generates a threshold voltage;
   a comparator that compares said threshold voltage with said output of said buffer to obtain an output digital signal; and
   a phase detector that determines a phase difference between said output digital signal and a second input signal, wherein said phase difference is directly proportional to said slew rate at said output of said buffer;
 a loop filter that produces a DC voltage from an output of said phase detector;
 a second reference voltage generator that generates a reference voltage; and
 an amplifier that (a) receives said DC voltage from said loop filter and said reference voltage generated by said second reference voltage generator, and (b) amplifies the difference between (i) said DC voltage from said loop filter and (ii) said reference voltage to obtain a control voltage, wherein said control voltage is fed back to said buffer, wherein said slew rate at said output of said buffer is determined using said control voltage.

9. The slew rate locked loop circuit of claim 8, wherein said slew rate of said buffer is directly proportional to said reference voltage of said second reference voltage generator which is constant.

10. The slew rate locked loop circuit of claim 8, wherein said constant slew rate is obtained when an error between said output of said loop filter and said reference voltage of said second reference voltage generator becomes zero.

\* \* \* \* \*